United States Patent [19]

Mizoguchi et al.

[11] Patent Number: 5,191,553
[45] Date of Patent: Mar. 2, 1993

[54] SEMICONDUCTOR MEMORY HAVING A PLURALITY OF PORTS

[75] Inventors: Satoshi Mizoguchi; Yasuhiro Sugimoto, both of Yokohama, Japan

[73] Assignee: Kabushiki Kaisha Toshiba, Kawasaki, Japan

[21] Appl. No.: 621,978

[22] Filed: Dec. 4, 1990

[30] Foreign Application Priority Data

Dec. 4, 1989 [JP] Japan .................. 1-313410

[51] Int. Cl.$^5$ .................................. G11C 7/00
[52] U.S. Cl. .................. 365/189.06; 365/230.05
[58] Field of Search .............. 365/189.04, 189.06, 365/208, 230.05

[56] References Cited

U.S. PATENT DOCUMENTS

| | | | |
|---|---|---|---|
| 4,694,429 | 9/1987 | Tanaka et al. | 365/189.06 X |
| 4,785,427 | 11/1988 | Young | 365/189.06 |
| 4,829,477 | 5/1989 | Suzuki et al. | 365/189.06 |
| 4,833,649 | 5/1989 | Greub | 365/189.06 |
| 5,016,214 | 5/1991 | Laymoun | 365/230.05 X |
| 5,124,950 | 6/1992 | Fukushi et al. | 365/230.05 X |
| 5,132,936 | 7/1992 | Keswick et al. | 365/189.06 |

OTHER PUBLICATIONS

1989 Symposium on VLSI Circuits, Digest of Technical Papers (IEEE Cat. No. 89 TH 0262-6, JSAP Cat. No. AP891216), 6-1 (pp. 67-68), A 4ns 16k BiCMOS SRAM, W. Heimsch et al., May 25-27, 1989.
Kevin J. O'Connor, "The Twin-Port Memory Cell", IEEE Journal of Solid State Circuit, vol. SC-22, No. 5, Oct. 1987, pp. 712-720.
"Double Port RAM in CMOS Technology", IBM Technical Disclosure Bulletin, vol. 28, No. 4, Sep. 1985, pp. 1613-1614.

*Primary Examiner*—Eugene R. LaRoche
*Assistant Examiner*—Son Dinh
*Attorney, Agent, or Firm*—Banner, Birch, McKie & Beckett

[57] ABSTRACT

This invention discloses a static random access memory having a plurality of data writing/reading ports, including a pair of bit lines of a first port and a pair of bit lines of second port, a memory cell for storing and outputting data, a bit line sense amplifier for sensing and amplifying data from the memory cell, a first transfer gate arranged between a first node of the memory cell and a first bit line of the first port, a second transfer gate arranged between a second node of the memory cell and the second bit line of the first port, a third transfer gate arranged between the first node of the memory cell and the first bit line of the second port, and a fourth transfer gate arranged between the second node of the memory cell and the second bit line of the second port, a drain source transconductance of the third and fourth transfer gates being larger than a drain-source transconductance of the first and second transfer gates, first and second base ground circuits, arranged between the bit line sense amplifier of the first port and the first bit line and between the bit line sense amplifier of the first port and the second bit line, for clamping a potential of each of the first pair of bit lines to a predetermined level upon start of a read operation of data.

11 Claims, 3 Drawing Sheets

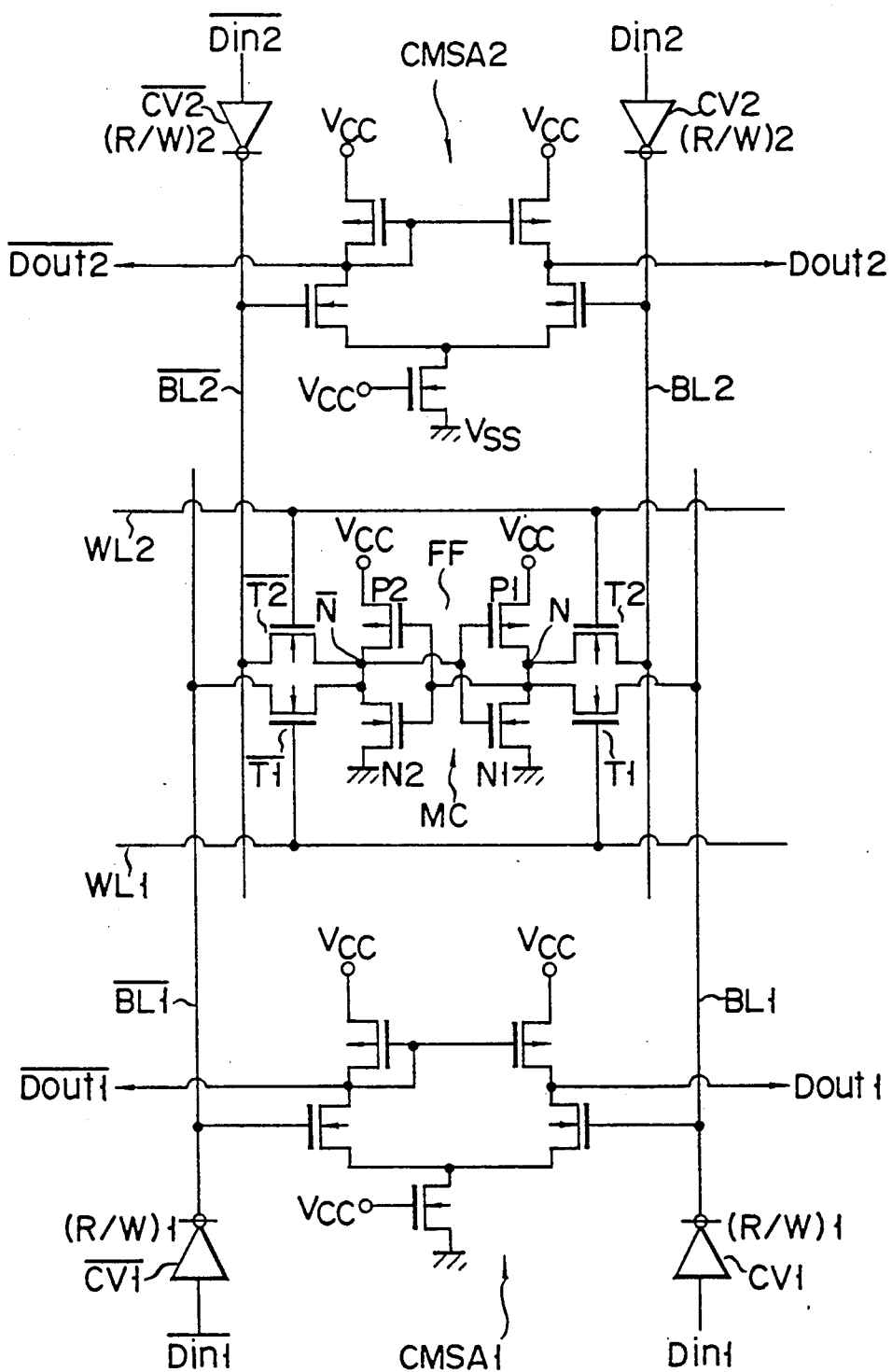
F I G. 1

SEMICONDUCTOR MEMORY HAVING A PLURALITY OF PORTS

BACKGROUND OF THE INVENTION

1. Field of the Invention

The present invention relates to a semiconductor memory and, more particularly, to a static random access memory (SRAM) having a plurality of ports.

2. Description of the Related Art

In recent years, in a field of an image signal memory or the like, a plural port SRAM having at least one port capable of reading data from a dual or triple port SRAM cell having a plurality of ports regardless of other ports in a writing state or a reading state.

FIG. 1 shows a part of a conventional dual port SRAM. In this case, reference symbol Vcc denotes a power source potential (e.g., 5 V); Vss, a ground potential; MC, a dual port SRAM cell; Din1 and $\overline{Din1}$, complementary write data of a first port; Din2 and $\overline{Din2}$, complementary write data of a second data ; Dout1 and $\overline{Dout1}$, complementary readout data of the first port; and Dout2 and $\overline{Dout2}$, complementary readout data of the second port. A pair of complementary bit lines BL1 and $\overline{BL1}$ of the first port and a word line WL1 of the first port are connected to an SRAM cell. The output terminals of write clocked inverters CV1 and $\overline{CV1}$ of the first port and the input terminal of a CMOS current mirror type bit line sense amplifier CMSA1 of the first port are connected to the pair of bit lines BL1 and $\overline{BL1}$ of the first port. A pair of complementary bit lines BL2 and $\overline{BL2}$ of the second port and a word line WL2 of the second port are connected to an SRAM cell MC.

The output terminals of write clocked inverters CV2 and $\overline{CV2}$ and the input terminal of a CMOS current mirror type bit line sense amplifier CMSA2 of the second port are connected to the bit lines BL2 and $\overline{BL2}$ of the second port.

The write clocked inverters CV1 and $\overline{CV1}$ of the first port are driven by an inversion control signal (R/W) 1 of the first port which is set at low level ("L") during a read operation and set at high level ("H") during a write operation. The write clocked inverters CV2 and $\overline{CV2}$ are driven by an inversion control signal (R/W) 2 of the second port which is set at "L" level during a read operation and set at "H" level during a write operation.

The dual port SRAM cell MC is constituted as follows. That is, a flip-flop (comprising two load p-channel MOS transistors P1 and P2 and two drive n-channel MOS transistors N1 and N2 which are connected across each other) FF is connected between a Vcc power source and a ground terminal, and one terminal of each of a pair of n-channel MOS transistors T1 and $\overline{T1}$ serving as transfer gates of the first port is connected to a corresponding one of a pair of input/output nodes N and $\overline{N}$ of the flip-flop FF. In addition, one terminal of each of a pair of n-channel MOS transistors T2 and $\overline{T2}$ serving as transfer gates of the second port is connected to a corresponding one of the pair of input/ output nodes N and $\overline{N}$ of the flip-flop FF. The gates of the pair of n-channel MOS transistors T1 and $\overline{T1}$ and are connected to the word line WL1 of the first port, and the other terminal of each of the pair of transistors T1 and $\overline{T1}$ is connected to a corresponding one of the bit lines BL1 and $\overline{BL1}$ the first port. The gates of the pair of n-channel MOS transistors T2 and $\overline{T2}$ are connected to the word line WL2 of the second port, and the other terminal of each of the pair of transistors T2 and $\overline{T2}$ is connected to a corresponding one of the pairs of BL2 and $\overline{BL2}$ of the second port.

Therefore, in the dual port SRAM, a read/write operation by the first port and a read/write operation by the second port can be independently performed.

In the dual port SRAM with the above arrangement, during a write operation of the SRAM cell MC from the first or second port, the potential of the pair of bit lines BL1 and $\overline{BL1}$ or the pair of BL2 and $\overline{BL2}$ are changed from the ground potential to the power source potential Vcc. In this case, a large number of SRAM cells MC are connected to the pair of bit lines BL1 and $\overline{BL1}$ and the pair of bit lines BL2 and $\overline{BL2}$, and the pairs of bit lines have a large amount of parasitic capacitance. Therefore, since an SRAM cell MC selected during a read operation must charge/discharge the large amount of parasitic capacitance from the pair of bit lines BL1 and $\overline{BL1}$ or the pair of bit lines BL2 and $\overline{BL2}$, a time required for reading data is prolonged.

In a high-speed single port SRAM formed by a Bi (bipolar)—CMOS (complementary insulated gate type) technique, a method of decreasing a potential amplitude of a bit line during a read operation by a current sensing circuit in which a base ground circuit is connected to an input side of an emitter coupling bit line sense amplifier so as to reduce a read time delayed by the parasitic capacitance of the bit lines is disclosed in a literature (1989 SYMPOSIUM ON VLSI CIRCUITS, Digest of Technical Papers, pp. 67 to 68).

For this reason, the above current sensing circuit will be used as an arbitrary port of a plural port SRAM. However, in the plural port SRAM, when a read operation is performed from a port using the current sensing circuit during a write operation, a device in which the potential of the bit line using the current sensing circuit does not adversely affect the write operation must be developed.

As described above, according to a conventional plural port semiconductor memory, since a memory cell selected during a read operation must charge/discharge a large amount of parasitic capacitance of a pair of bit lines, a time required for reading data is enlarged.

SUMMARY OF THE INVENTION

It is an object of the present invention to provide a plural port semiconductor memory capable of reading out data at a high speed and of stably writing data.

According to the present invention, there is provided a plural port semiconductor memory having at least one port capable of reading out data from a static memory cell having a plurality of ports regardless states of other ports, comprising a bipolar transistor an emitter of which is connected to a bit line to an input side of a bit line sense amplifier of at least one port of the plurality of ports and a base of which is applied with a read/write operation control signal, and a resistor connected between a collector of the bipolar transistor and a power source potential, wherein a base ground circuit for extracting an output from the collector of the bipolar transistor is connected, and a value of a drain-source transconductance of a transfer gate connected to a pair of bit lines of a port which is connected to the base ground circuit of a plurality of ports of the memory cell is set to be smaller than a value of a drain-source transconductance of a transfer gate of a memory cell connected to a pair of bit lines of a port which is not connected to the base ground circuit.

For example, when a read operation is performed from the second port connected to the base ground circuit while a write operation is performed from the first port, as a control signal applied to a base of a transistor of the base ground circuit of the second port, a voltage enough to operate a transfer gate of a memory cell connected to the pair of bit lines of the second port is used. At this time, potentials of bit lines of the pair of bit lines of the second port are determined by a content stored in the memory cell, and complementary readout data of the bit line sense amplifier are determined in accordance with the potentials.

In this case, even when a potential of the bit line of second port is kept to be constant at an emitter potential of the transistor of the base ground circuit, a potential required for inverting a flip-flop of the memory cell can be applied from a write circuit of the first port. That is, assuming that a drive ability of the write circuit of the first port is sufficiently large, a voltage applied to an input/output node of the flip-flop in the memory cell is determined by a ratio of a drain-source transconductance of the transfer gate of the second port to a drain-source transconductance of the transfer gate of the first port. Since the value of the drain-source transconductance of the transfer gate of the second port is set to be smaller than the value of the drain-source transconductance during a read operation from the second port, data from the first port can be stably and properly written in the memory cell.

Contrast to this, when a write operation from the second port and a read operation from the first port are to be simultaneously performed, a control signal having a low voltage at which a potential of a bit line of the second port is not clamped to be constant at an emitter potential of the transistor of the base ground circuit is applied to a base of the transistor of the base ground circuit to drive the write circuit of the second port, thereby writing data from the second port.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a circuit diagram showing a conventional static random access memory having a plurality of ports;

DETAILED DESCRIPTION OF THE PREFERRED EMBODIMENTS

An embodiment of the present invention will be described below with reference to the accompanying drawings.

Figure 2:
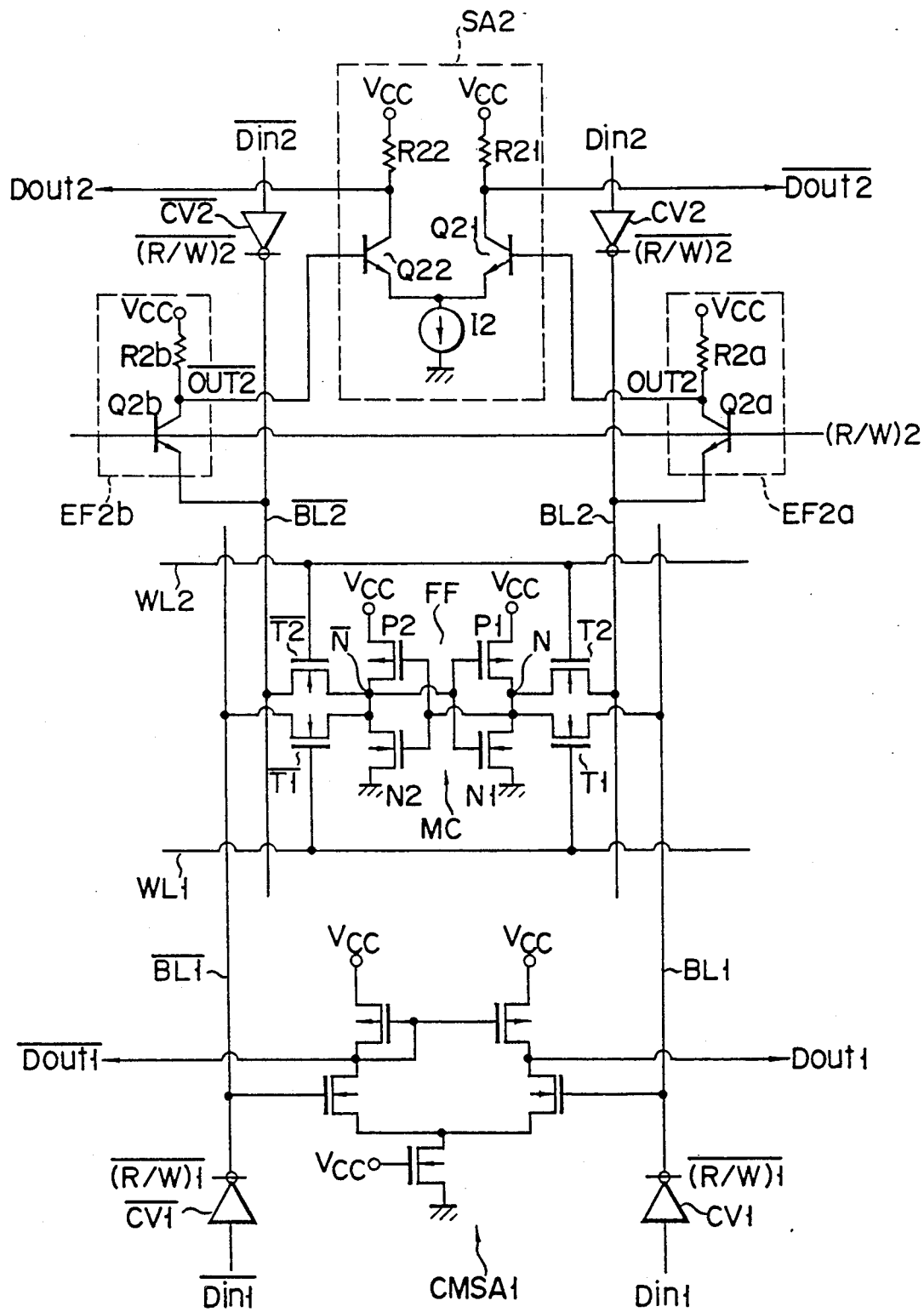
FIG. 2 is a circuit diagram showing a static random access memory having a plurality of ports according to an embodiment of the present invention.

FIG. 2 shows a part of a dual port SRAM having following points different from the conventional dual port SRAM described above with reference to FIG. 1. That is, in a port requiring a high-speed read operation, e.g., a second port, a current sensing circuit is used in place of the CMOS current mirror type bit line sense amplifier, and a value of a drain-source transconductance Gds is set to be described later. Since the remaining parts are the same as in FIG. 1, the same reference numerals in FIG. 2 denote the same parts as in FIG. 1, and a description of the parts will be omitted.

In the current sensing circuit, base ground circuits EF2a and EF2b are connected between two inputs of a bit line sense amplifier SA2 and bit lines BL and $\overline{BL}$, respectively. The base ground circuit EF2a comprises an npn transistor Q2a an emitter of which is connected to a bit line BL2 of a pair of bit lines of a second port and a base of which is applied with a second port control signal (R/W) 2 which is set at "H" level during a read operation of the second port and set at "L" level during a write operation, and a resistor R2a connected between the collector of the npn transistor Q2a and a power source potential Vcc. The base ground circuit EF2b comprises an npn transistor Q2b an emitter of which is connected to a bit line $\overline{BL2}$ of a pair of bit lines of the second port and a base of which is applied with a second port control signal (R/W) 2 which is set at "H" level during a read operation of the second port and set at "L" level during a write operation, and a resistor R2b connected between the collector of the npn transistor Q2b and the power source potential Vcc. Complementary readout signals OUT2 and $\overline{OUT2}$ are extracted from the collectors of the npn transistors Q2a and Q2b of the base ground circuits EF2a and EF2b.

The bit line sense amplifier SA2 comprises a pair of amplifying differential npn transistors Q21 and Q22 in which the complementary readout signals OUT2 and $\overline{OUT2}$ are input to the corresponding bases, a constant current source I2 connected between a common connection point of the emitters of the npn transistors Q21 and Q22 and a ground potential, and resistors R21 and R22 connected between a Vcc and the corresponding npn transistors Q21 and Q22. The bit line sense amplifier SA2 outputs complementary readout data Dout2 and $\overline{Dout2}$ from the collectors of the npn transistors Q21 and Q22.

A value of a drain-source transconductance Gds of transfer gates T2 and $\overline{T2}$ connected to the bit lines BL2 and $\overline{BL2}$ of the second port connected to the base ground circuits EF2a and EF2b of a plurality of ports of an SRAM cell MC is set to be smaller than that of a drain-source transconductance Gds of transfer gates T1 and $\overline{T1}$ of an SRAM cell MC connected to a pair of bit lines BL1 and $\overline{BL1}$ of the first port to which the base ground circuits EF2a and EF2b are not connected. This setting can be obtained by optimally setting a transistor size ratio of the transfer gates T1 and $\overline{T1}$ of the first port to the transfer gates T2 and $\overline{T2}$ of the second port. More specifically, channel lengths or channel widths of the transfer gates T1 and $\overline{T1}$ of the first port and the transfer gates T2 and $\overline{T2}$ are optimally set, thereby setting the transconductance Gds.

In the SRAM cell MC, two load resistors each having a high resistance may be used in place of the two load p-channel MOS transistors P1 and P2 connected across each other.

Referring to FIG. 2, although only one SRAM cell MC is shown, SRAM cells MC are arranged in a matrix form of n×m. The SRAM cells MC in the same row are commonly connected to a word line WL1 of the first port and commonly connected to a word line WL2 of the second port. The SRAM cells MC in the same column are commonly connected to bit lines BL1 and $\overline{BL1}$ and commonly connected to the pair of bit lines BL2 and $\overline{BL2}$ of the second port.

A read/write operation of the SRAM cell MC will be described below. In the SRAM cell MC, a read/write operation of the first port and a read/write operation of the second port can be simultaneously and independently performed. Since a current sensing circuit is used in the second port, potentials of the bit lines BL2 and $\overline{BL2}$ during the read operation in the second port are kept to be constant at an emitter potential of the npn transistors Q2a and Q2b of the base ground circuits EF2a and EF2b. Therefore, since the bit lines BL2 and $\overline{BL2}$ have small potential amplitudes, parasitic capacitances of the bit lines BL2 and $\overline{BL2}$ need not be charged/discharged, and a read time can be reduced, thereby obtaining a high-speed read operation. That is, a control signal (R/W) 2 of the second port goes to "H" level during the read operation. When the signal (R/W) 2 goes to "H" level, the npn transistors Q2a and Q2b are electrically turned on, and emitter currents of the emitters of the npn transistors Q2a and Q2b are supplied to the bit lines BL2 and $\overline{BL2}$. When the emitter currents are supplied to the bit lines BL2 and $\overline{BL2}$ impedances of the bit lines BL2 and BL2 are decreased, and parasitic capacitances of the bit lines BL2 and $\overline{BL2}$ need not be charged/discharged.

An operation for performing read operation from the second port while a write operation is performed from the first port will be described below. Write clocked inverters CV2 and $\overline{CV2}$ controlled to be an inactive state by the inversion control signal (R/W) 2. The control signal (R/W) 2 applied to the bases of the npn transistors Q2a and Q2b of the base ground circuits EF2a and EF2b is a voltage Vr enough to operate the transfer gates T2 and $\overline{T2}$ connected to the pair of bit lines BL2 and $\overline{BL2}$ of the second port. At this time, the potential of the pair of bit lines BL2 and $\overline{BL2}$ of the second port is Vr−VBE or more, since an emitter current is supplied from the emitters of the npn transistors Q2a and Q2b to the pair of bit lines BL2 and $\overline{BL2}$. In this case, VBE indicates a base-emitter voltage of each of the npn transistors Q2a and Q2b.

It is assumed that a drive transistor N1 of the SRAM cell MC is set in an ON state and that a drive transistor N2 is set in an OFF state. In this state, a drain current is supplied to the transfer gate T2 connected to the bit line BL2. This drain current has a value equal to that of the emitter current of the npn transistors Q2a of the base ground circuit EF2a connected to the bit line BL2, and a collector current equal to the emitter current is supplied to the resistor R2a thereby dropping a voltage. Therefore, an amplifying npn transistor Q21 of the bit line sense amplifier SA2 is set in an OFF state. At this time, since the drive transistor N2 is set in an OFF state, the drain current is not supplied to the transfer gate $\overline{T2}$ connected to the bit line $\overline{BL2}$. For this reason, the npn transistor Q2b is not turned on, and a current is not supplied to the resistor R2b connected to the bit line $\overline{BL2}$. A voltage drop does not occur at a connection point between the resistor R2b and the collector of the npn transistor Q2b, and the amplifying npn transistor Q22 of the bit line sense amplifier SA2 is set in an ON state. Therefore, readout data Dout2 and readout data $\overline{Dout2}$ from the bit line sense amplifier SA2 are set at "L" level.

In this case, even when the potentials of the bit lines BL2 and $\overline{BL2}$ of the second port are kept to be constant at the emitter potentials of the np transistors Q2a and Q2b of the base ground circuits EF2a and EF2b, a potential required for inverting the flip-flop FF of the SRAM cell MC can be applied from the write clocked inverters CV1 and $\overline{CV1}$ of the first port activated by the inversion control signal (R/W) 1. That is, when a drive ability of the write clocked inverters CV1 and $\overline{CV1}$ of the first port is sufficiently large, a voltage applied to an input/output node N of the flip-flop in the SRAM cell MC is determined by a ratio of the drain-source transconductance Gds of the transfer gate T2 of the second port to that of the transfer gate T1 of the first port. According to this embodiment, however, since the value of drain-source transconductance Gds of the transfer gate T2 of the second port is set to be smaller than that of the drain-source conductance Gds of the transfer gate T1 of the first port, the data Din1 and $\overline{Din1}$ from the first port can be stably and properly written in the SRAM cell MC.

Contrast to the above description, when a write operation from the second port and a read operation from the first port are simultaneously performed, the write clocked inverters CV1 and $\overline{CV1}$ of the first port are set in an inactive state by the inversion control signal (R/W) 1. The control signal (R/W) 2 having a low voltage at which the potentials of the bit lines BL2 and $\overline{BL2}$ of the second port are not clamped to be constant at the emitter potentials of the npn transistors Q2a and Q2b is applied to the bases of the npn transistors Q2 of the base ground circuits EF2a and EF2b of the second port. That is, the data Din2 and $\overline{Din2}$ from the second port can be written by driving the write clocked inverters CV2 and $\overline{CV2}$ of the second port not to turn on the npn transistors Q2a and Q2b.

Figure 3:
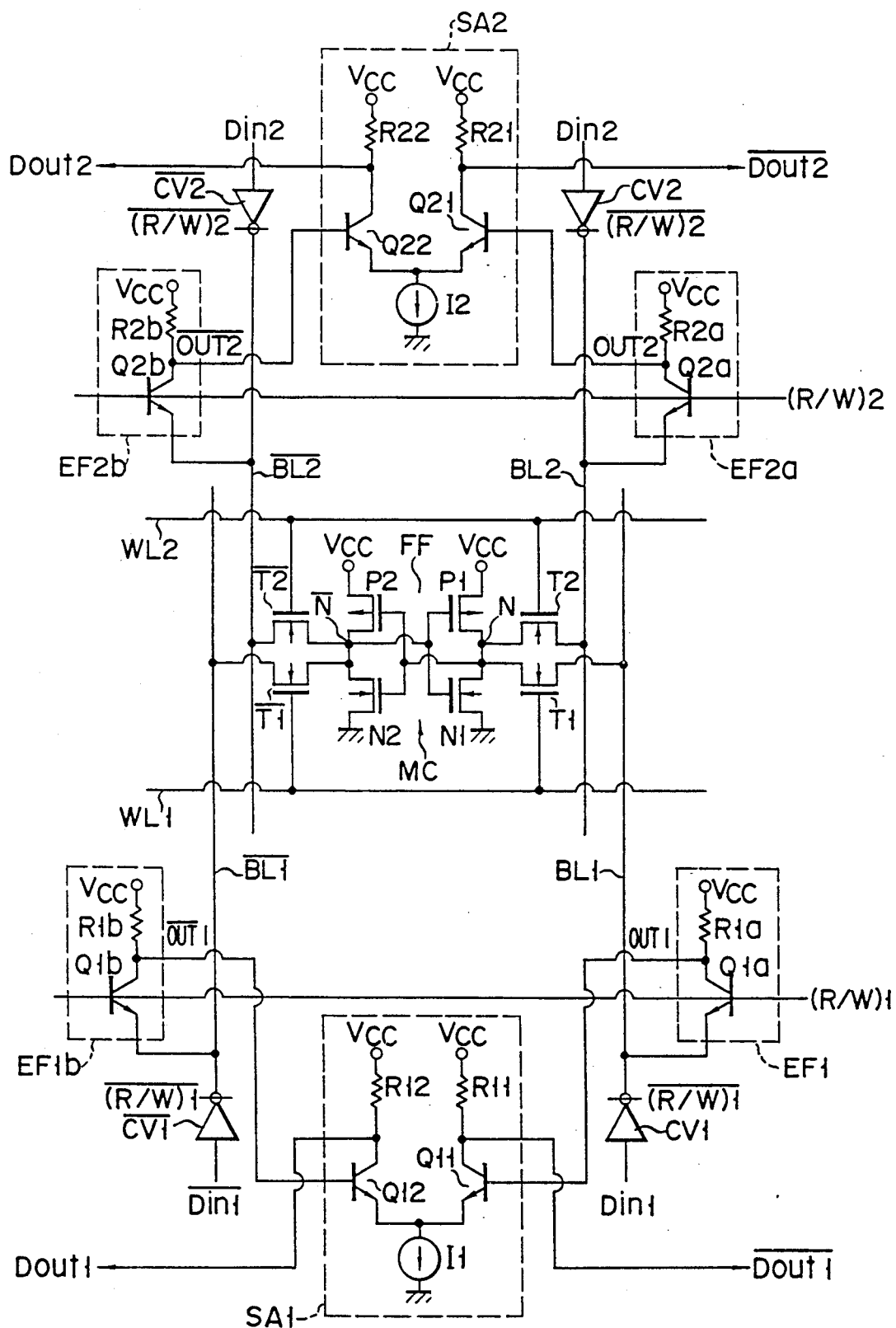
FIG. 3 is a circuit diagram showing a static random access memory having a plurality of ports according to another embodiment of the present invention.

FIG. 3 shows a part of a dual port SRAM according to another embodiment of the present invention. This embodiment has the following points different from the above described dual port SRAM. A bit line sense amplifier SA1 and base ground circuits EF1a and EF1b are also provided on a first port side. That is, all ports have current sensing circuits, and the drain-source transconductance Gds of the transfer gates T1 and $\overline{T1}$ and the drain-source transconductance Gds of the transfer gates T2 and $\overline{T2}$, i.e., transistor sizes, are set to have the same value in all the ports. Since the remaining parts are the same parts as in FIG. 2, the same reference numerals in FIG. 3 denote the same parts as in FIG. 2, and a description of the parts will be omitted.

In a current sensing circuit of the first port, the base ground circuit EF1a comprises an np transistor Q1a and a resistor R1a, and the base ground circuit EF1b comprises an npn transistor Q1b and a resistor 1b. The base ground circuit EF1a outputs a readout signal OUT1, and the base ground circuit EF1b outputs a signal OUT1 complementary with the signal $\overline{OUT1}$. A bit line sense amplifier SA1 comprises amplifying differential npn transistors Q11 and Q12, a constant current source I1, and resistors R11 and R12.

In the dual port SRAM cell MC shown in FIG. 3, a read/write operation will be described below. In the dual port SRAM, a read/write operation by the first port and a read/write operation by the second port can be independently and simultaneously performed as in the previous embodiment. Since current sensing circuits are used in all the ports, a high-speed read operation can be performed in each port. In this case, in the SRAM cell MC, since the drain-source transconductance Gds of the transfer gates T1 and $\overline{T1}$ and the drain-source transconductance Gds of the transfer gates T2 and $\overline{T2}$, i.e., transistor sizes, are set to have the same value in all the ports, the same read operation can be performed in all the ports.

A read operation from the second port while a write operation from the first port is performed will be described below. The write clocked inverters CV2 and $\overline{CV2}$ of the second port are set in an inactive state. A control signal (R/W) 1 having a voltage at which the potentials of the bit lines BL1 and $\overline{BL1}$ of the first port are not clamped to be constant at the emitter potentials of the npn transistors Q1a and Q1b is applied to the bases of the npn transistors Q1a and Q1b of the base ground circuits EF1a and EF1b of the first port. A control signal (R/W) 2 having a voltage Vr enough to operate the transfer gates T2 and $\overline{T2}$ connected to the pair of bit lines BL2 and $\overline{BL2}$ of the second port is applied to the bases of the npn transistors Q2a and Q2b of the base ground circuits EF2a and EF2b of the second port. At this time, the potential of each of the pair of bit lines BL2 and $\overline{BL2}$ of the second port is $Vr - VBE$ or more. In this case, the VBE is a base-emitter voltage of each of the npn transistors Q2a and Q2b.

When a drive transistor N1 of the SRAM cell MC is set in an ON state and a drive transistor N2 is set in an OFF state, a drain current is supplied to the transfer gate T2 connected to the bit line BL2. This drain current has a value equal to that of the emitter current of the npn transistor Q2a of the base ground circuit EF2a of the second port connected to the bit line BL2. Since a collector current equal to the emitter current is supplied to the resistor R2, a voltage drop occurs between the resistor R2 and the collector of the npn transistor Q2a. Therefore, an amplifying npn transistor Q21 of the bit line sense amplifier SA2 is turned off. At this time, the drive transistor N2 is turned off, and the drain current is not supplied to the transfer gate $\overline{T2}$ connected to the bit line $\overline{BL2}$. The npn transistor Q2b is not turned on, and no current is supplied to the resistor R2b connected to the bit line $\overline{BL2}$. A voltage drop does not occur at a connecting point between the resistor R2b and the collector of the npn transistor Q2b, and the amplifying npn transistor Q22 of the bit line sense amplifier SA2 is set in an ON state. Therefore, readout data $\overline{Dout2}$ from the bit line sense amplifier SA2 goes to "L" level, and readout data Dout2 goes to "H" level.

In this case, even when the potentials of the bit lines BL2 and $\overline{BL2}$ of the second port are clamped to be constant at emitter potentials of the npn transistors Q2a and Q2b of the base ground circuits EF2a and EF2b, a potential required for inverting a flip-flop FF of the SRAM cell can be applied from the write clocked inverters CV1 and $\overline{CV1}$ of the first port.

That is, assuming that a drive ability of the write clocked inverters CV1 and $\overline{CV1}$ of the first port is sufficiently large, a voltage applied to an input/output node N or $\overline{N}$ of the flip-flop FF in the SRAM cell MC is determined by a ratio of a drain-source transconductance of the transfer gate (T2 or $\overline{T2}$) of the second port to a drain-source transconductance of the transfer gate (T1 or $\overline{T1}$) of the first gate. At this time, in a read operation from the second port, the potentials of the bit lines BL2 and $\overline{BL2}$ of the second port are clamped to be constant at the emitter potentials of the npn transistors Q2a and Q2b of the base ground circuits EF2a and EF2b. When the potential of the bit line (BL1 or $\overline{BL1}$) of the first port is set at 0 V ("L" level) by the write clocked inverter (CV1 or $\overline{CV1}$), the value of the drain-source transconductance of the transfer gate (T2 or $\overline{T2}$ of the second port is larger than that of the drain-source transconductance of the transfer gate (T1 or $\overline{T1}$). Therefore, the data Din1 or $\overline{Din1}$ from the first port can be stably and securely written in the SRAM cell MC.

In the above embodiment, although a case wherein all the memory cells are dual port SRAM cells is described, the present invention can be applied to a semiconductor memory in which a dual port SRAM is used in some memory cells.

Although a dual port SRAM is described in the above embodiment, the present invention can be generally applied to a plural port semiconductor memory having at least one port which is capable of reading out data regardless of a read/write state of other ports.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A static random access memory having a plurality of data read/write ports, comprising:

a pair of bit lines of a first port and a pair of bit lines of a second port;

a memory cell for storing write data from one of said pair of bit lines of said first port and said pair of bit lines of said second port and outputting readout data from a selected one of said pair of bit lines of said first port and said pair of bit lines of said second port;

a bit line sense amplifier of said first port for sensing and amplifying readout data from said memory cell;

a bit line sense amplifier of said second port for sensing and amplifying readout data from said memory cell;

a first transfer gate arranged between a first input/output node of said memory cell and the first bit line of said pair of bit lines of said first port, and a second transfer gate arranged between a second input/output node of said memory cell and the second bit line of said pair of bit lines of said first port; and a third transfer gate arranged between said input/output node of said memory cell and the first bit line of said pair of bit lines of said second port, and a fourth transfer gate arranged between the second input/output node of said memory cell and the second bit line of said pair of bit lines of the second port;

wherein first and second bit line potential clamping means are arranged between a first input node of said bit line sense amplifier of the first port and the first bit line of said first pair of bit lines and between a second input node of said bit line sense amplifier of said first port and the second bit line of said first pair of bit lines, said first second bit line potential clamping means clamps a potential of each of said first pair of bit lines to a predetermined level and supplies readout data from said memory cell to said first and second input nodes of said bit line sense amplifier of said first port upon start of a read operation of data, and a value of a drain-source transconductance of said first and second transfer gates is smaller than a value of a drain-source transconductance of said third and fourth transfer gate.

2. A memory according to claim 1, wherein each of said first and second bit line potential clamping means includes a resistor on terminal of which is connected to a power source potential terminal and other terminal of which is connected to a collector of an npn transistor, and said npn transistor a base of which receives a control signal which is set at high level during a read operation and which is set at low level during a write operation and an emitter of which is connected to said pair of bit lines.

3. A memory according to claim 1, wherein said first, second, third, and fourth transfer gates are MOS transistors.

4. A static random access memory having a plurality of data read/write ports, comprising:
a pair of bit lines of a first port and a pair of bit lines of a second port;
a memory cell for storing write data from one of said pair of bit lines of said first port and said pair of bit lines of said second port and outputting readout data from a selected one of said pair of bit lines of said first port and said pair of bit lines of said second port;
a bit line sense amplifier of said first port for sensing and amplifying readout data from said memory cell;
a bit line sense amplifier of said second port for sensing and amplifying readout data from said memory cell;
a first transfer gate arranged between a first input/output node of said memory cell and the first bit line of said pair of bit lines of said first port, and a second transfer gate arranged between a second input/ output node of said memory cell and the second bit line of said pair of bit lines of said first port;
a third transfer gate arranged between said first input/output node of said memory cell and the first bit line of said pair of bit lines of said second port, and a fourth transfer gate arranged between said second input/output node of said memory cell and the second bit line of said pair of bit lines of the second port, a drain-source transconductance of said third and fourth transfer gates being larger than a drain-gate transconductance of said first and second transfer gates; and
first and second bit line potential clamping means, arranged between said first input node of said bit line sense amplifier of said first port and the first bit line of said first pair of bit lines and between said second input node of said bit line sense amplifier of said first port and the second bit line of said first pair of bit lines, respectively, for clamping a potential of each of said first pair of bit lines to a predetermined level upon start of a read operation of data, and supplying readout data from said memory cell to said first and second input nodes of said bit line sense amplifier of said first port.

5. A memory according to claim 4, wherein each of said first and second bit line potential clamping means includes a resistor one terminal of which is connected to a power source potential terminal and other terminal of which is connected to a collector of an npn transistor, and said npn transistor a base of which receives a control signal which is set at high level during a read operation and which is set at low level during a write operation and an emitter of which is connected to said pair of bit lines.

6. A memory according to claim 4, wherein said first, second, third, and fourth transfer gates are MOS transistors.

7. A static random access memory having a plurality of data read/write ports, comprising:
a pair of bit lines of a first port and a pair of bit lines of a second port;
a memory cell for storing write data from one of said pair of bit lines of said first port and said pair of bit lines of said second port and outputting readout data from a selected one of said pair of bit lines of said first port and said pair of bit lines of said second port;
a bit line sense amplifier of said first port for sensing and amplifying readout data from said memory cell;
a bit line sense amplifier of said second port for sensing and amplifying readout data from said memory cell;
a first transfer gate arranged between a first input/output node of said memory cell and the first bit line of said pair of bit lines of said first port, and a second transfer gate arranged between a second input/ output node of said memory cell and the second bit line of said pair of bit lines of said first port;
a third transfer gate arranged between said first input/output node of said memory cell and the first bit line of said pair of bit lines of said second port, and a fourth transfer gate arranged between said second input/output node of said memory cell and the second bit line of said pair of bit lines of the second port, a drain-source transconductance of said third and fourth transfer gates being equal to a drain-gate transconductance of said first and second transfer gates;
first and second bit line potential clamping means, arranged between said first input node of said bit line sense amplifier of said first port and the first bit line of said first pair of bit lines and between said second input node of said bit line sense amplifier of said first port and the second bit line of said first pair of bit lines, respectively, for clamping a potential of each of said first pair of bit lines to a predetermined level upon start of a read operation of data, and supplying readout data from said memory cell to said first and second input nodes of said bit line sense amplifier of said first port; and
third and fourth bit line potential clamping means, arranged between said first input node of said bit line sense amplifier of said second port and the first bit line of said second pair of bit lines and between said second input node of said bit line sense amplifier of said second port and the second bit line of said pair of bit lines, respectively, for clamping a potential of each of said second pair of bit lines to a predetermined level upon start of a read operation of data, and supplying readout data from said memory cell to said first and second input nodes of said bit line sense amplifier of said second port.

8. A memory according to claim 7, wherein each of said first, second, third, and fourth bit line potential clamping means includes a resistor one terminal of which is connected to a power source potential terminal and other terminal of which is connected to a collector of an npn transistor, and said npn transistor a base of which receives a control signal which is set at high level during a read operation and which is set at low level during a write operation and an emitter of which is connected to said pair of bit lines.

9. A memory according to claim 7, wherein said first, second, third, and fourth transfer gates are MOS transistors.

10. A static random access memory having a plurality of data read/write ports, comprising:

a pair of bit lines of a first port and a pair of bit lines of a second port;

a memory cell for storing write data from one of said pair of bit lines of said first port and said pair of bit lines of said second port and outputting readout data from a selected from one of said pair of bit lines of said first port and said pair of bit lines of said second port;

a bit line sense amplifier of said first port for sensing and amplifying readout data from said memory cell;

a bit line sense amplifier of said second port for sensing and amplifying readout data from said memory cell;

a first transfer gate consisting of a MOS transistor arranged between a first input/output node of said memory cell and the first bit line of said pair of bit lines of said first port, and a second transfer gate consisting of a MOS transistor arranged between a second input/output node of said memory cell and the second bit line of said pair of bit lines of said first port;

a third transfer gate consisting of a MOS transistor arranged between said first input/output node of said memory cell and the first bit line of said pair of bit line of said second port, a fourth transfer gate consisting of a MOS transistor arranged between said input/output node of said memory cell and the second bit line of said pair of bit lines of said second port, a drain-source transconductance of said third and fourth transfer gates being larger than a drain-gate; transconductance of said first and second transfer gates; and first and second bit line potential clamping means, which are arranged between said first input node of said bit line amplifier of the first port and the first bit line of said first pair of bit lines and between the second input node of said bit line sense amplifier of said first port and the second bit line of said first pair of bit lines, respectively, and each of which is constituted by a resistor one terminal of which is connected to a power source potential terminal and other terminal of which is connected to a collector of an npn transistor and said npn transistor a base of which receives a control signal which is set at a high level during a read operation of data and which is set at low level during a write operation of data and an emitter of which is connected to said pair of bit lines, for clamping a potential of each of said first pair of bit lines to a predetermined level and input readout data from said memory cell to said first and second input nodes of said bit line sense amplifier of said first port.

11. A static random access memory having a plurality of data read/write ports, comprising:

a pair of bit lines of a first port and a pair of bit lines of a second port;

a memory cell for storing write data from one of said pair of bit lines of said first port and said pair of bit lines of said second port and outputting readout data from a selected one of said pair of bit lines of said first port and said pair of bit lines of said second port;

a bit line sense amplifier of said first port for sensing and amplifying readout data from said memory cell;

a bit line sense amplifier of said second port for sensing and amplifying readout data from said memory cell;

a first transfer gate consisting of a MOS transistor arranged between a first input/output node of said memory cell and the first bit line of said pair of bit lines of said first port, and a second transfer gate consisting of a MOS transistor arranged between a second input/output node of said memory cell and the second bit line of said pair of bit lines of said first port;

a third transfer gate consisting of a MOS transistor arranged between said first input/output node of said memory cell and the first bit line of said pair of bit line of said second port, a fourth transfer gate consisting of a MOS transistor arranged between said input/output node of said memory cell and the second bit line of said pair of bit lines of said second port, a drain-source transconductance of said third and fourth transfer gates being equal to a drain-gate transconductance of said first and second transfer gates;

first and second bit line potential clamping means, arranged between said first input node of said bit line sense amplifier of said first port and the first bit line of said first pair of bit lines and between said second input node of said bit line sense amplifier of said first port and the second bit line of said first pair of bit lines, respectively, for clamping a potential of each of said first pair of bit lines upon start of a read operation of data, and supplying readout data from said memory cell to said first and second input nodes of said bit line sense amplifier of said first port; and third and fourth bit line potential clamping means, which are arranged between said first input node of said bit line amplifier of the first port and the first bit line of said first pair of bit lines and between the second input node of said bit line sense amplifier of said first port and the second bit line of said first pair of bit lines, respectively, and each of which is constituted by a resistor one terminal of which is connected to a power source potential terminal and other terminal of which is connected to a collector of an npn transistor and said npn transistor a base of which receives a control signal which is set at high level during a read operation of data and which is set at low level during a write operation of data and an emitter of which is connected to said pair of bit lines, for clamping a potential of each of said first pair of bit lines to a predetermined level upon start of a read operation of data and input readout data from said memory cell to said first and second input node of said bit line sense amplifier of said second port.

* * * * *